(12) United States Patent
Hofmeister et al.

(10) Patent No.: US 7,712,808 B2
(45) Date of Patent: May 11, 2010

(54) END EFFECTOR WITH CENTERING GRIP

(75) Inventors: Christopher Hofmeister, Hampstead, NH (US); Steve Bibeault, Littleton, MA (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 274 days.

(21) Appl. No.: 11/239,272

(22) Filed: Sep. 29, 2005
(Under 37 CFR 1.47)

(65) Prior Publication Data
US 2007/0081883 A1    Apr. 12, 2007

(51) Int. Cl.
*B25J 15/00* (2006.01)
*B65G 49/07* (2006.01)

(52) U.S. Cl. .................. 294/119.1; 414/744.5; 414/941

(58) Field of Classification Search ................ 294/1.1, 294/99.1, 119.1, 103.1; 901/36; 414/935, 414/936, 941, 744.5
See application file for complete search history.

(56) References Cited

U.S. PATENT DOCUMENTS

| | | | | |
|---|---|---|---|---|
| 3,874,525 | A | * | 4/1975 | Hassan et al. ............ 414/744.4 |
| 5,700,046 | A | * | 12/1997 | Van Doren et al. ........ 294/119.1 |
| 6,155,773 | A | * | 12/2000 | Ebbing et al. ............. 414/744.5 |
| 6,174,011 | B1 | | 1/2001 | Keigler ....................... 294/99.1 |
| 6,322,312 | B1 | | 11/2001 | Sundar .................... 414/744.5 |
| 6,474,712 | B1 | * | 11/2002 | Govzman et al. ........... 294/106 |
| 6,572,320 | B2 | * | 6/2003 | Davis ......................... 414/217 |
| 7,140,655 | B2 | * | 11/2006 | Kesil et al. .................. 294/104 |
| 7,234,913 | B2 | * | 6/2007 | Heiland et al. ............. 414/806 |

FOREIGN PATENT DOCUMENTS

WO    WO/00/62334    10/2000

* cited by examiner

*Primary Examiner*—Dean J Kramer
(74) *Attorney, Agent, or Firm*—Perman & Green, LLP; Richard Pickreign

(57) ABSTRACT

A flat workpiece transport apparatus having a movable arm and an end effector. The end effector is connected to the arm. The end effector has a movable grip for holding a flat workpiece on the end effector. The end effector has a grip actuator operably connected to the movable grip. The grip actuator has more than one actuation members and a resiliently flexible member connecting the more than one actuation members. Each actuation member actuates at least one corresponding grip element of the movable grip to capture or release the workpiece. Flexure of the resiliently flexible member effects movement of at least one of the more than one actuation members for actuation of the at least one corresponding grip element. The resiliently flexible member is sandwiched by substantially rigid portions of the more than one actuation members.

9 Claims, 5 Drawing Sheets

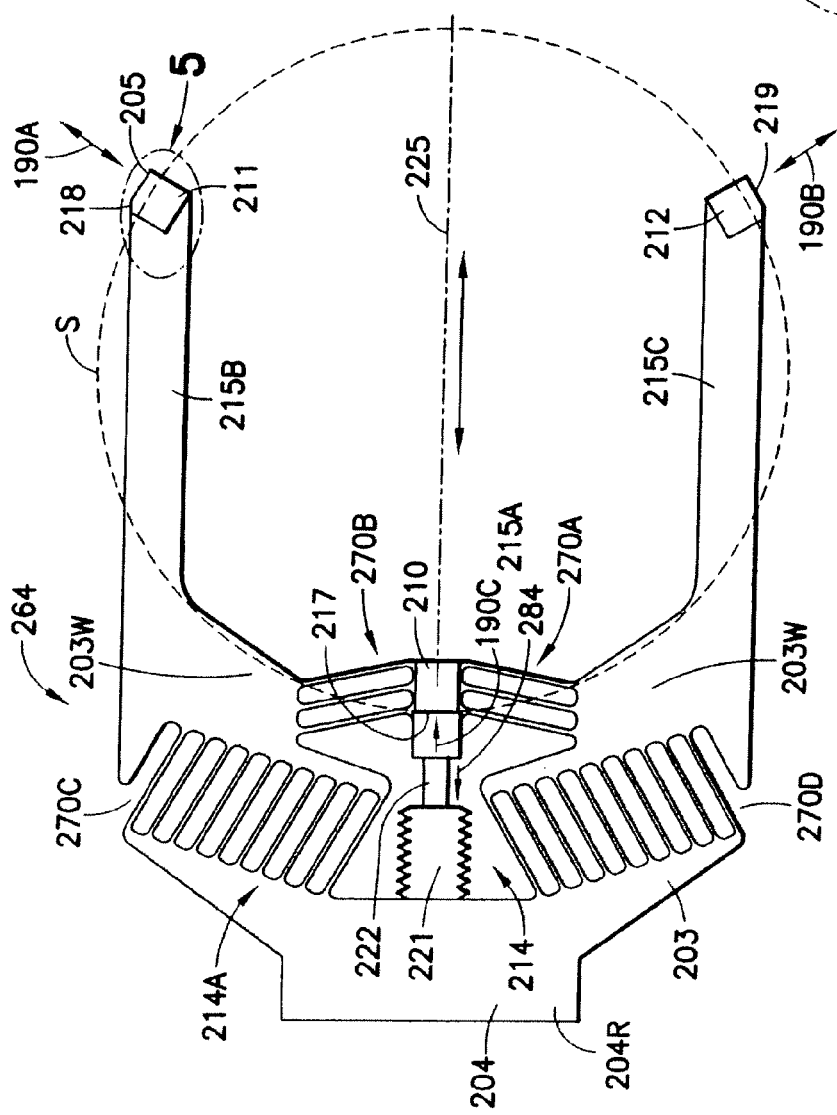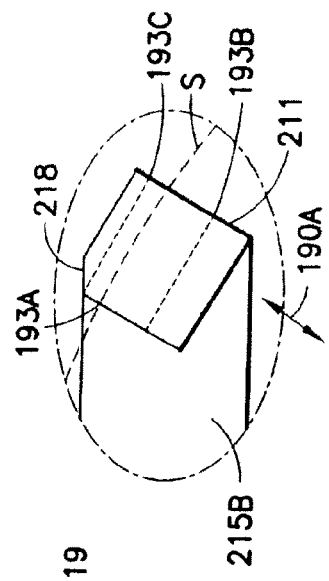

END EFFECTOR WITH CENTERING GRIP

BACKGROUND

1. Field of the Invention

The present invention relates to a device for gripping flat, thin, workpieces, on an end effector used for handling and transporting such workpieces.

2. Brief Description of Related Developments

Common in the processing of semiconductor substrates and similar devices is the desire to move the substrate from station to station, into and out of various chambers at a given station, and amongst multiple orientations as indicated by the overall processing layout. To accomplish this, the substrate is generally releasably held on a holding platform or end effector as a suitable transport mechanism or robot.

The throughput of any processing system is dependent on the speed at which the substrate can be moved. Therefore each movement in each step of the process has a direct impact on throughput. There is a need to speed up the movements of the end effector at all phases of the process. This has placed increased burdens on the means used to secure the substrate on the end effector platform in order to avoid displacement of the substrate.

There are many types of conventional handling systems specifically designed for holding workpieces like semiconductor wafers, and transporting them between workstations and or wafer cassettes. Among these are passive holding systems using an annular ring member to position a wafer and an annular flange or lip to support the workpieces, for example, in U.S. Pat. No. 4,584,045, U.S. Pat. No. 4,749,330, and U.S. Pat. No. 5,334,257, which are hereby incorporated by reference in their entirety. Many of these conventional types of passive holding systems may not provide sufficient grip for use on high speed robots.

Another conventional approach to increase holding capability is to provide an active grip that uses a vacuum platform, wherein a flat upper surface with vacuum ports is brought into contact with the underside of a workpiece and suction is applied at the port to secure the workpiece to the platform, U.S. Pat. No. 4,770,590 U.S. Pat. Nos. 5,064,030, 5,135,349 and 5,765,444, which are hereby incorporated by reference in their entirety, disclose such a means.

Still another approach to solve these pressing problems makes use of a Bernoulli effect on the top side of the workpiece. U.S. Pat. Nos. 5,080,549 and 5,324,155, which are hereby incorporated by reference in their entirety, disclose such a system wherein a paddle with appropriately placed gas exhaust ports is brought into close proximity with the top side of a workpiece. Nevertheless, the gripping systems employing suction effects for holding the workpieces are complex (employing complex tight fittings at movable joints) and expensive to manufacture. Moreover, such system cannot operate in a vacuum environment.

Still another conventional approach for holding workpieces on transports is the use of one or more movable mechanical grippers such as gripping arms, fingers or tabs. The grippers are moved relative to one another to change the distance between contact surfaces which, when brought to a gripping position, clamp the workpiece in place relative to the transport assembly. In systems of this type it is advantageous to construct the contact surface in a manner that allows engagement of the workpiece at its circumference/outer edge.

Gripping mechanisms that are designed to provide movement of the contacting and clamping members are described in U.S. Pat. Nos. 6,174,011 and 6,322,312, which are hereby incorporated by reference in their entirety. The '011 patent describes a circular disc that supports the substrate. The circumference of the disc is expanded and contracted by the operation of a series of radially oriented leaf springs to allow three circumferentially displaced holding fingers to disengage and engage the substrate. In the '312 patent a pair of clamp fingers are spring biased to engage the substrate from one side to force the substrate into engagement with opposing fixed clamp fingers. The above illustrate the problems with conventional transport apparatus with conventional gripping mechanism. For example, the conventional gripping mechanism described in U.S. Pat. No. 6,174,011, which is hereby incorporated by reference in its entirety, provides a gripper with actuable holding fingers distributed around the perimeter of substrate that results in low force contact between holding fingers and substrate edge during closure of the gripper and transport system movement (i.e., inertial efforts between substrate and holding fingers). However, the gripping mechanism in this case is complex and costly to manufacture (e.g. the flexible radial spokes 40 are expensive and time consuming to cut even when using a wire cutting tool). The examples of the gripping mechanisms described in U.S. Pat. No. 6,322,312, which is hereby incorporated by reference in its entirety, generally include grippers with actuable clamp fingers on but the proximal side (i.e. closest to the base of the end effector) of this substrate (fixed fingers are located on the distal side providing a gripper that is not as effective in holding the substrate at high transport speeds and also suffers from lower gripper closure speeds), and grippers having all clamp fingers that are actuable but with a complex actuation system. The transport apparatus in accordance with the exemplary embodiments of the present invention overcome the problems of the conventional substrate transport apparatus as will be described in greater detail below.

SUMMARY OF THE EXEMPLARY EMBODIMENTS

In accordance with one exemplary embodiment of the present invention, a flat work piece transport apparatus is provided. The apparatus comprises a movable arm, and an end effector. The end effector is connected to the arm. The end effector has a movable grip for holding a flat workpiece on the end effector. The end effector has a grip actuator operably connected to the movable grip. The grip actuator has more than one actuation members in a resiliently flexible member connecting the more than one actuation members. Each actuation member actuates at least one corresponding grip element of the movable grip to capture or release the work piece. Flexure of the resiliently flexible member effects movement of at least one of the more than one actuation members for actuation of the at least one corresponding grip element. The resiliently flexible member is sandwiched by substantially rigid portions of the more than one actuation members.

In accordance with another exemplary embodiment, a flat workpiece transfer apparatus is provided. The apparatus comprises a movable arm and an end effector. The end effector is connected to the arm. The end effector has a movable grip for holding a flat workpiece on the end effector. The end effector has a grip actuator operably connected to the movable grip. The grip actuator has more than one actuation members. The more than one actuation members extending longitudinally. A connecting device is joined at each end to the more than one actuation members and has reciprocating sections at each end. The end effector has a resiliently flexible member located between a fixed member of the end effector and at least one of the more than one actuation members. The resilient force of the resiliently flexible member moves at least one of the more than one actuation members for actuation of at least one corresponding grip element.

In accordance with yet another exemplary embodiment, a flat workpiece transfer apparatus is provided. The apparatus comprises a movable arm and an end effector. The end effector has a base portion, an actuation portion and gripping portions. The base portion connects the end effector to the movable arm. The gripping portions are attached to the base portion by the actuation portion. The actuation portion has flexible sections effecting movement of the gripping portions. An actuator is operably connected to one of the flexible sections. Actuation of the actuator causes outward movement of at least one of the gripping portions. At least one of the gripping portions is attached to more than one of the flexible sections and pulling on the one flexible section with the actuator causes a pushing force on the other flexible sections effecting the outward movement of at least one of the other gripping portions. The flexible sections guide the movement of the gripping portions.

BRIEF DESCRIPTION OF THE DRAWINGS

The foregoing aspects and other features of the present invention are explained in the following description, with reference to the accompanying drawings, in which:

FIG. 6 is a plan view of an end effector in accordance with yet another exemplary embodiment; and FIG. 7 is a partial plan view of the end effector of FIG. 6.

DETAILED DESCRIPTION OF THE EXEMPLARY EMBODIMENTS

Figure 1:
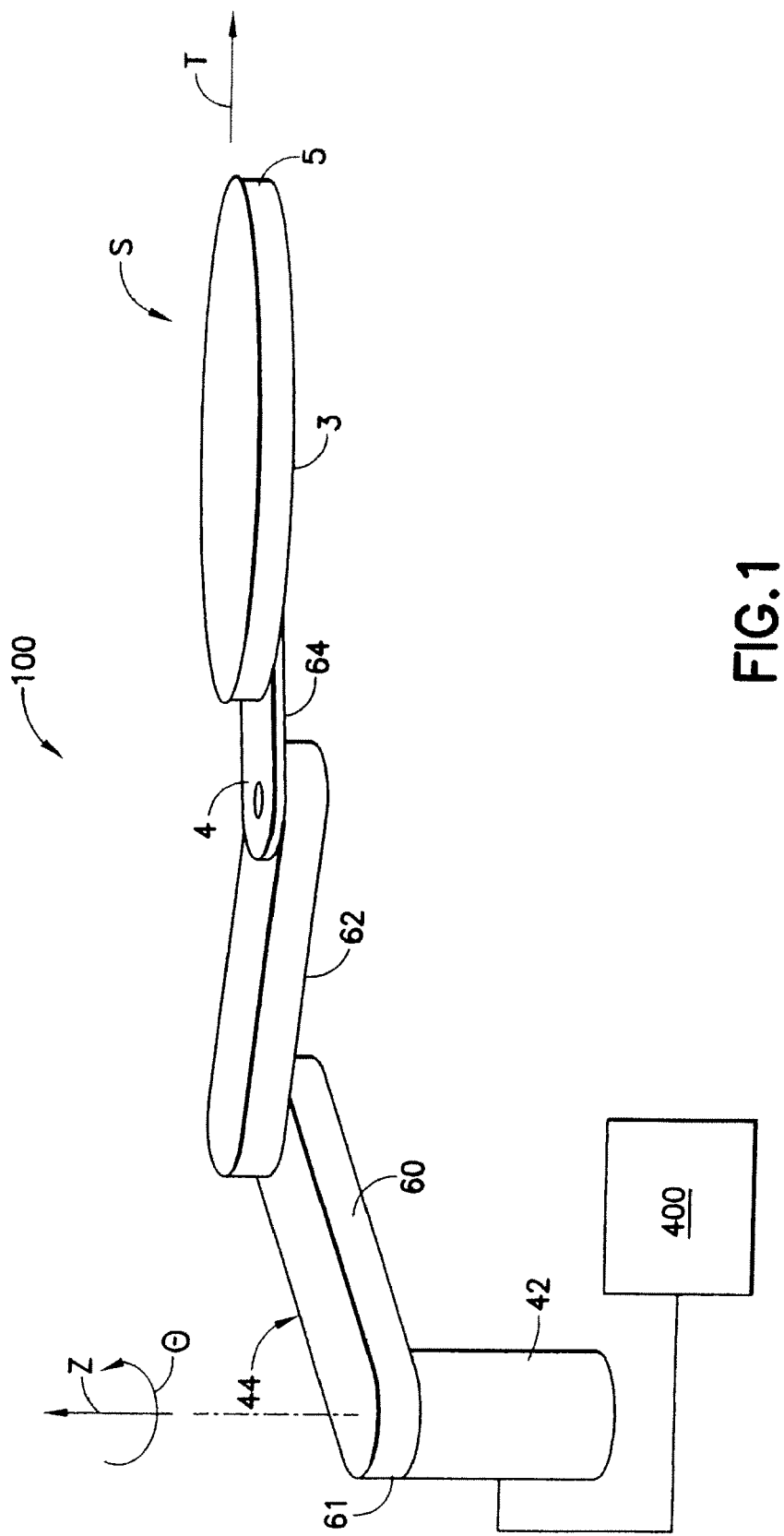
FIG. 1 is a schematic perspective view of a substrate transport apparatus incorporating features in accordance with an exemplary embodiment of the present invention, and a substrate S.

A substrate transport apparatus 100 incorporating the features of the present invention and substrate S are illustrated in FIG. 1. Although the present invention will be described with reference to the exemplary embodiments shown in the drawings, it should be understood that the present invention can be embodied in alternate forms. In addition, any suitable size, shape or type of elements or materials could be used.

The transport apparatus 100 schematically shown in FIG. 1 is a representative transport apparatus capable of moving the flat workpiece S as desired, such as for example at least along three axes (as indicated by arrows z, θ, T, in FIG. 1). The flat workpiece S is an exemplary workpiece and is shown as having a round outer circumference for example purposes only. The workpiece S may be any flat workpiece such as a 200 mm or 300 mm semiconductor wafer used in manufacture of semiconductor devices, a semiconductor lithography panel such as a mask or reticle, or flat panel for flat panel displays. In the embodiment shown in FIG. 1, the transport apparatus 100 has a movable arm 44 that has a general scara configuration. In alternate embodiments, the transport apparatus may have any other suitable configuration, with an articulated arm of any suitable type (e.g. frogleg), or with no articulated arm.

Generally as seen in FIG. 1, the movable arm 44 in this embodiment is a scara type arm including upper arm 60, forearm 62, and end effector 64. In alternate embodiments, any suitable type of transport arm may be used. The upper arm 60 and forearm 62 are pivotally linked in series. The upper arm is connected to the drive section 42. In this embodiment, the drive section 42 of the transport apparatus 100 may be fixedly mounted to a frame (not shown) of a workpiece workstation (not shown). In alternate embodiments, the drive section may be mounted on a car capable of movement in the horizontal plane relative to the frame of the apparatus. The drive section 42 may be a three-axis drive section capable of moving the movable arm 44 along three axes Z, θ, T). The drive section 42 may include suitable drives (not shown) for vertically raising and lowering (i.e. movement along the "Z" axis) the movable arm 44. In addition, the drive 42 may include a co-axial drive assembly (not shown) for moving the movable arm 44 about the rotation axis θ (i.e. θ movement) and for rotating the upperarm 60, forearm 62 and end effector 64 to effect extending or retracting the arm along the radial axis T (i.e. T movement).

A suitable example of a co-axial drive assembly is disclosed in U.S. Pat. No. 5,899,658, which is incorporated by reference herein in its entirety. In alternate embodiments, the co-axial drive may be any other suitable drive capable of moving the movable arm to generate both θ movement and T movement. Controller 400 is connected to the drive section 42 to control arm movements.

Figure 2:
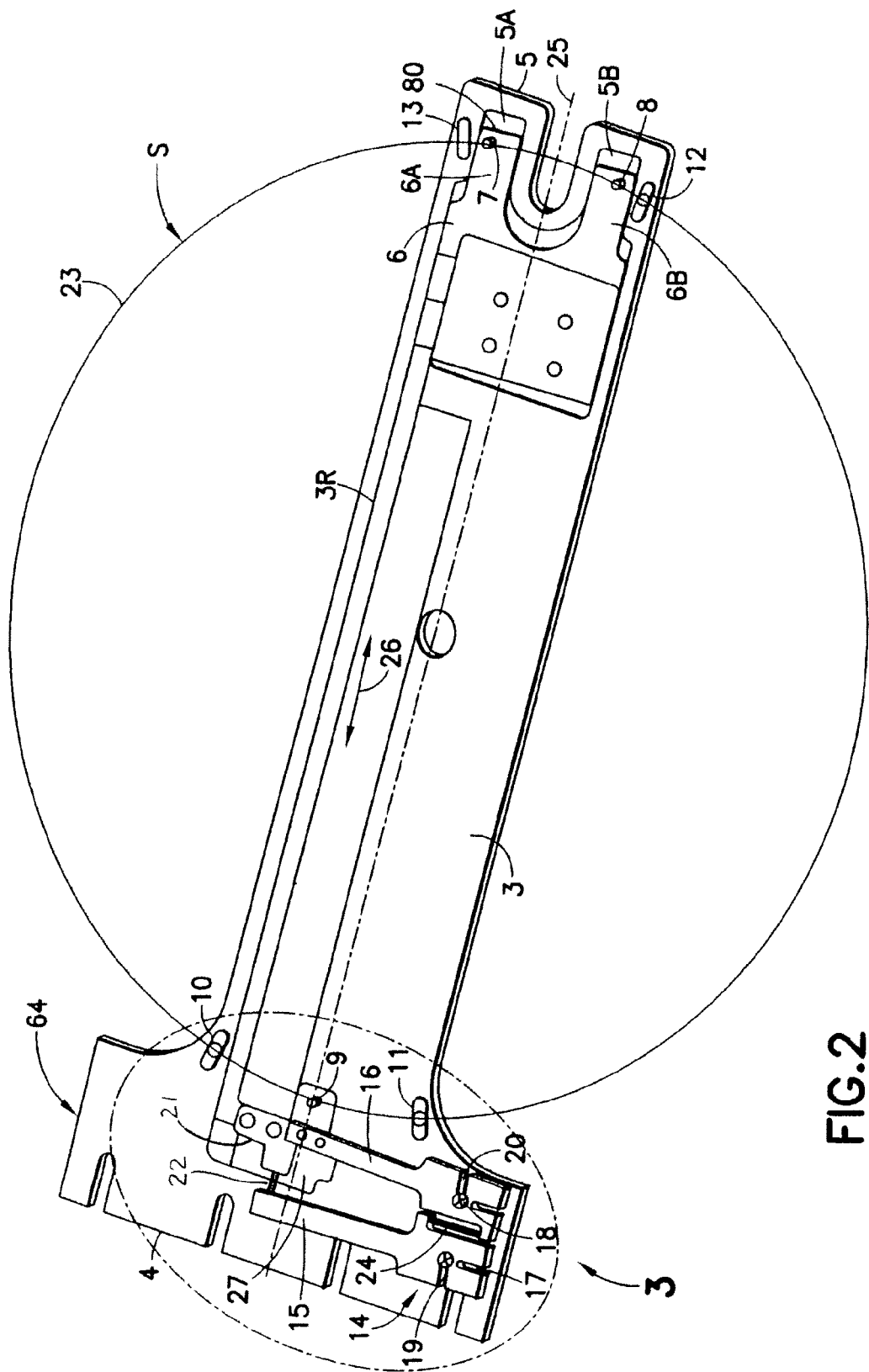
FIG. 2 is a plan view of an end effector of the transport apparatus in FIG. 1.

As shown in FIG. 1-2, the end effector 64 is constructed, in this embodiment, for attachment to the end of movable arm 100 and is adapted for supporting the workpiece S in a secure manner. End effector 64 is constructed having a frame 3 with an attachment end 4 and a distal end 5. The workpiece S is supported from below on support pads 10-13. In this embodiment, pads 10-13 are positioned as shown in FIG. 2 to contact the workpiece S only along the circumferential edge 23. Workpiece S is held in place by gripping pins 7, 8 and 9 spaced circumferentially around the edge 23 of the workpiece S. Gripping pins 7-9 engage the edge 23 by the gripping force provided by actuating mechanism 14. Although three gripping pins are shown for illustration, more could be provided or a different type of engaging surface could be provided, according to the particular needs of the process and workpiece.

As seen in FIG. 2, the frame 3 of the end effector in this embodiment has a general paddle shape, elongated along axis 25, that is substantially aligned with motion axis T. In alternate embodiments, the end effector frame may have any other suitable shape as for example a forked arm configuration. The actuating mechanism 14 for gripping pins 7-9 may have a spring loaded actuation section 14A with a pair of arms 15 and 16 connected by means of a flexible element, such as a leaf spring 24. Arm 16 is attached or integrally constructed to an elongated member 6 that extends towards the distal end 5 of the frame 3. Member 6 is mounted on the frame 3 for unrestricted movement parallel to the longitudinal axis 25 of the end effector 2, as shown by arrow 26 of FIG. 2. In this embodiment, the frame 3 may have a recess or opening 3R formed therein so that when mounted to the frame the member 6 is generally included within the profile of the frame 3. The frame 3 and member 6 are shaped to define a complementing guide system 80 stably holding member 6 in the frame and allowing unrestricted movement of member 6 in direction of arrow 26. In this embodiment member 6 has end fingers 6A, 6B received in complementing slots 5A, 5B of the frame 3. Gripping pins 7 and 8 are fixed to the member 6 and provide the outer means by which the workpiece is held. Gripping pins 7 and 8 move with the assembly or integral element consisting of arm 16 and member 6. Arm 16 is attached to the frame 3 by means of a pivot 18 that is engaged in a slot 20 to allow arm 16 to pivot as shown by arrow 28 of FIG. 3. It can be observed from FIG. 2 that, as arm 16 pivots, member 6 slides inward and outward on frame 3 to position outer gripping pins 7 and 8.

Figure 3:
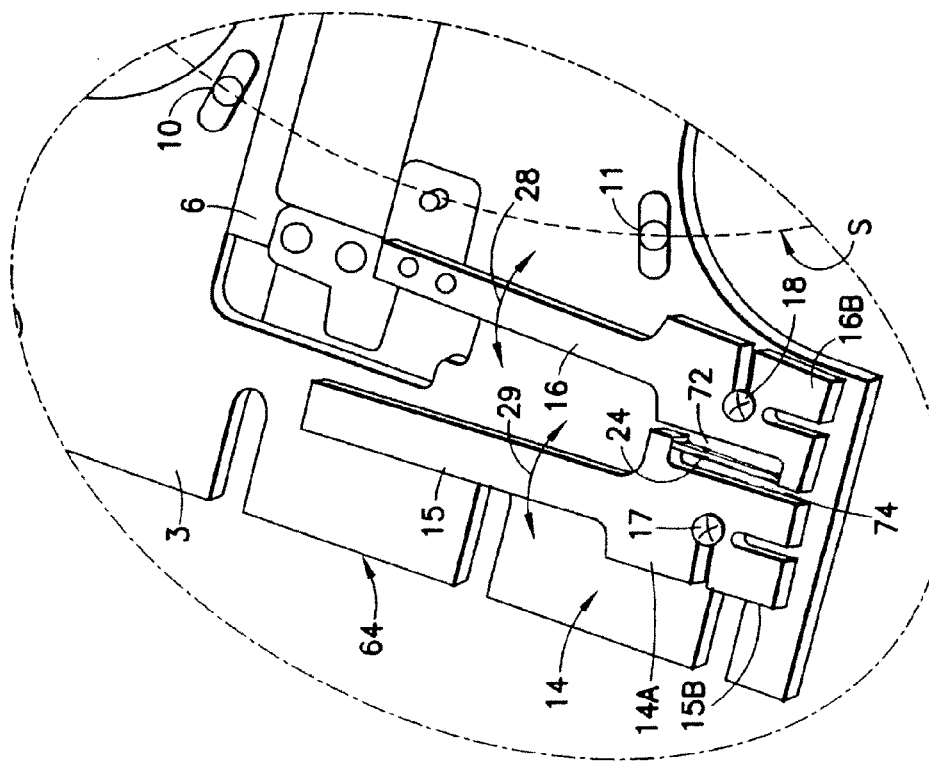
FIG. 3 is an enlarged view of the attachment end of the end effector shown in FIG. 2.

Referring also to FIG. 3, in this embodiment arm 15 is also connected to frame 3 by means of a pivot 17 engaged in slot 19 to allow a pivot motion according to arrow 29 of FIG. 3. Gripping pin 9 is fixed to arm 15 by means of an extension 27 within frame 3, near the attachment end of frame 3. Arm 15 is mounted for movement relative to arm 16 against the force of leaf spring 24 to position inner gripping pin 9.

Arms 15 and 16 are positioned on the frame 3 in substantially parallel orientation. The arms 15, 16 are generally oriented transverse to the longitudinal axis 25 of the end effector 64. As shown in FIG. 3, arms 15 and 16 are connected by a leaf spring 24. The use of a leaf spring 24, as shown in FIG. 3, permits the manufacture of arms 15 and 16 and leaf spring 24 as a member of unitary structure, thereby simplifying the overall construction and assembly of the end effector. As seen best in FIG. 3, in this embodiment leaf spring 24 is located between arms 15, 16 and extends longitudinally along the length of arms 15, 16. Thus, in this embodiment the configuration of the spring loaded actuation section 14A has the spring 24 sandwiched between the actuation arms 15, 16 as shown. The opposite ends of the spring 24 depend from corresponding top and bottom of the base portions 15B, 16B of the arms. The location of the end connections of the spring 24 to the base portions 15E, 16B may be established as desired to provide the spring with the desired length to generate the desired resilient force on the actuation mechanism 14. As seen in FIG. 3, base portions 15B, 16B are provided with an increased cross section relative to the distal portions of arms 15, 16 to provide desired rigidity of the arms relative to spring 24 and maximize the motion of the arms during actuation. The aforementioned configuration of the actuation section 14A provide the actuation section with a very compact shape that nevertheless is capable of generating a desired range of motion from the portions of arms 15, 16 driving the gripping pins 7-9. Moreover, the actuation section 14A may be arranged, as shown, transverse to the longitudinal axis 25 (see FIG. 2) of the end effector thereby allowing the overall length of the end effector 64 to be reduced (with the concomitant benefits of reduced end effector mass and movement of inertia and thus improved transport speed and control). By proper selection and positioning of the gripping pins 7-9 the workpiece can be held on the end effector securely in a predetermined position.

An actuator, which is shown as an electrical or pneumatic solenoid 21, is mounted for operative engagement with one or both of arms 15 and 16 to move the arms apart. This is accomplished, as illustrated in FIGS. 2 and 3 for example by engagement of the plunger 22 of solenoid 21 on arm 15. Extension of plunger 22 will cause pivotal movement of arm 15 resulting in a counter pivotal movement by arm 16. As illustrated in FIG. 3, solenoid 21 may for example be mounted on arm 16 with plunger 22 engaging arm 15. The pivotal motion of the arms will be equal and opposite, thereby causing a lateral movement of the pins 7 and 8 and pin 9 in opposite directions. In alternate embodiments, the solenoid could be placed in other positions such as fixed to frame 3 and engaging one of the arms 15 or 16 or it could be fixed to arm 15 and engage arm 16 with similar effect. As may be realized from FIGS. 2-3, actuation of one arm 15, 16 effects actuation of the opposing arm 15, 16 via spring 24 and independent of action of the solenoid 21 on the opposing arm. Other devices may be used to actuate the movement of arms 15 and 16 such as a stepping motor, vacuum, or a pneumatic element. Sensors (not shown) can be positioned to sense the position of the arms and this data can be used to move the gripping elements, for example, from a position where no workpiece is supported to positions that accommodate workpieces of different diameters or shapes.

In operation, when a substrate is to be acquired for support by end effector 64, solenoid 21 is actuated to pivot arms 15 and 16 in opposite directions. This motion in turn moves inner pin 9 and outer pins 7 and 8 to their expanded position, allowing clearance to position a workpiece S on the end effector 64. Release of solenoid plunger 22 causes the movement of arms 15 and 16 under the influence of leaf spring 24 to their rest position in which the pins 7-9 engage the workpiece S. Here, by opposite motion of pins 7, 8 and 9, the workpiece S is effectively centered and gripped on end effector 64.

Figure 4:
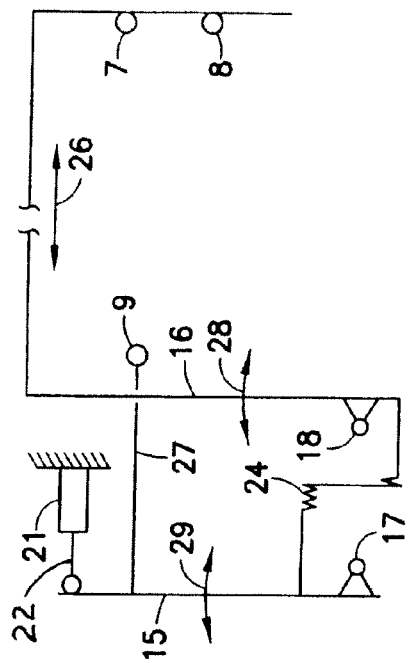
FIG. 4 is a schematic diagram of the operation of the gripping mechanism of the end effector in FIG. 2.

The operation of the actuator mechanism 14 is further illustrated schematically in FIG. 4 in which the relationship of the elements of the gripper are shown in simple form. Arms 15 and 16 are connected to allow pivotal motion in opposite directions to move one arm away from the other. As this motion occurs, the engagement pins or surfaces 7 and 8 move away from engagement pin or surface 9 longitudinally in the direction of arrow 26. The elongated member 6 is constrained within the frame 3 of the end effector 2 so that the pivot motion of arm 16 causes a lateral motion of the member 6 to move pins 7 and 8 to engage or disengage the workpiece. Similarly pivotal motion of arm 15 will cause a lateral motion of pin 9 to engage or disengage the workpiece. Pins 7 and 8 are positioned at the distal end 5 of frame 3 while pin 9 is positioned at the attachment end 4 of frame 3. In this manner actuation of the gripping mechanism 14 will cause engagement of the workpiece on opposite sides of the workpiece. The actuation mechanism 14 in this exemplary embodiment provides a compact actuator for longitudinally opening and closing gripping pins 7-8 and 9. This in turn allows positioning the grippers 7-9 proximate to the longitudinal axis 25 of the end effector, a position that is highly effective in restraining the substrate when moved along axis T (see FIG. 1) in which the substrate is subjected to the peak inertial forces. As may be realized, the highly compact actuation section 14A, due to the inherently resilient nature of spring 24, acts to generate an acceleration profile (over time) of the actuator that results in gentle constant forces on engagement of the substrate by pins 7, 8.

The operation of the mechanism 14 can be adapted to cooperate with mapping functions also provided within the end effector assembly. In addition the arms assembly 14 could be mounted at either end of the end effector.

Figure 5:
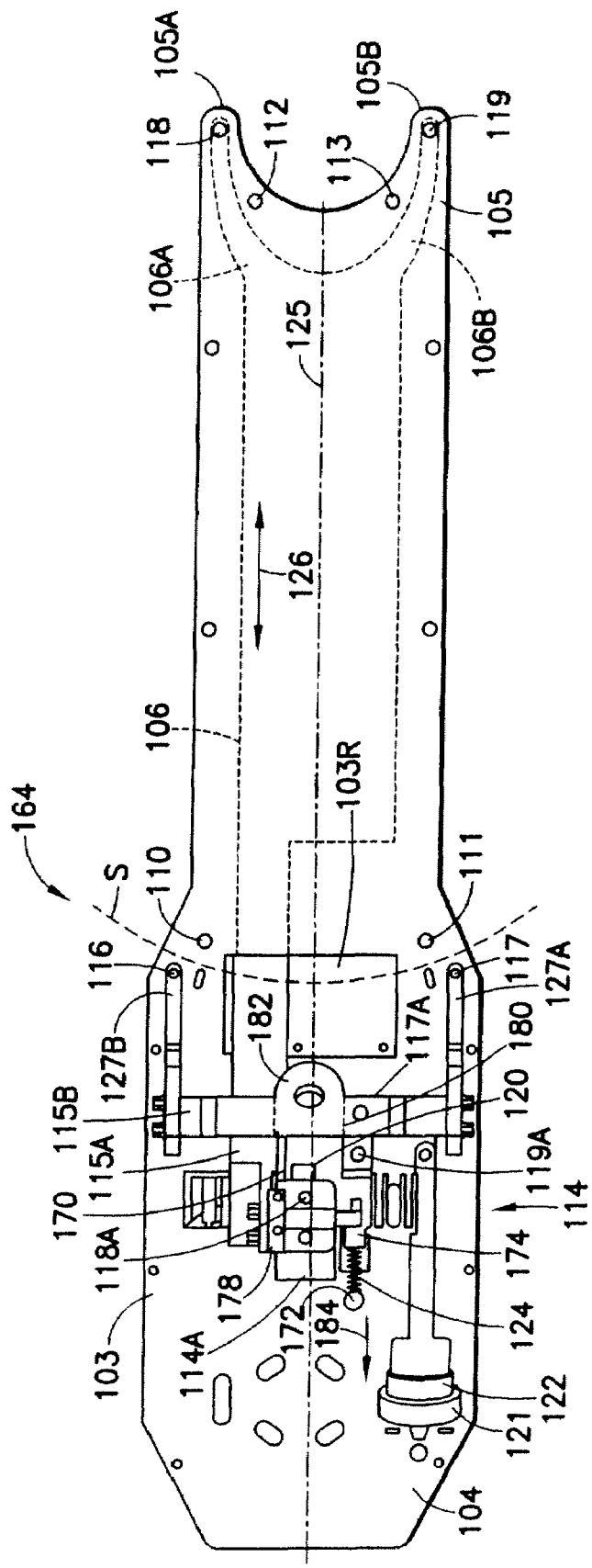
FIG. 5 is a plan view of an end effector in accordance with another exemplary embodiment.

Referring now to FIG. 5, there is shown a plan view of end effector 164 in accordance with another exemplary embodiment. End effector 164 is constructed, in this exemplary embodiment, for attachment to the end of movable arm 100 and is adapted for supporting the workpiece S in a secure manner. End effector 164 is constructed having a frame 103 with an attachment end 104 and a distal end 105. The workpiece S is supported from below on support pads 110-113. Pads 110-113 may be positioned, for example, to contact the workpiece S only along the circumferential edge. In alternate embodiments, the pads may be positioned for contacting the workpiece in any suitable location. Workpiece S is held in place by gripping pins 116-119. Gripping pins 116-119 may be spaced circumferentially around the edge of the workpiece S. In alternate embodiments, the gripping pins may be in any suitable configuration. Gripping pins 116-119 may engage the edge of workpiece S by the gripping force provided by actuating mechanism 114. Although four gripping pins are shown for illustration, in alternate embodiments, more or less could be provided. In other alternate embodiments, a different type of engaging surface could be provided according to the particular demands of the process and workpiece.

In this exemplary embodiment, frame 103 of the end effector may have a general paddle shape that may be elongated along longitudinal axis 125. Axis 125 may be substantially aligned with motion axis T (as best seen in FIG. 1). In alternate embodiments, the end effector frame may have any other suitable shape as for example, a forked arm configuration.

The actuating mechanism 114 for gripping pins 116-119 may have a spring loaded actuation section 114A having a pair of carriers 115A and 115B connected by means of a flexible element, such as, for example, a cable 170 as will be described below. In alternate embodiments, the carriers may be connected by means of a belt, chain or other suitable flexible means. Carrier 115A may be attached or integrally constructed to an elongated member 106 that, for example, may be a one piece member. Member 106 may extend longitudinally towards the distal end 105 of the frame 103. Member 106 may be mounted within the frame 103 for movement parallel to the longitudinal axis 125 of the end effector 164, as shown by arrow 126.

In this exemplary embodiment, the frame 103 may have a recess or opening 103R formed therein so that, when mounted to the frame, the member 106 is generally included within the profile of the frame 103. The frame 103 and member 106 may be shaped to define a complementing guide system stably holding member 106 in the frame and allowing unrestricted movement of member 106 in direction of arrow 126. In this exemplary embodiment, member 106 may have end fingers 106A, 106B. End fingers 106A, 106B may be received in complementing slots 105A, 105B of the frame 103. Gripping pins 118 and 119 may be connected to the member 106 (as shown in FIG. 5) and extend above the surface of the frame 103 to engage and securely hold the workpiece on the end effector. Gripping pins 118 and 119 move back and forth in the direction of arrow 126 with the assembly or integral element consisting of member 106.

Carrier 115A may be attached to the frame 103 by a slide 118A that may be engaged in a slot 120 allowing arm 106 to slide in the direction of arrow 126. As carrier 115A slides, member 106 slides inward and outward on frame 103 to position outer gripping pins 118 and 119 in a predetermined position. Carrier 115B may also be connected to frame 103 by means of a slide 117A. Slide 117A may be engaged in slot 119A allowing a back and forth motion of carrier 115B in the direction of arrow 126. Gripping pins 116 and 117 may be mounted to carrier 115B by extensions 127A, 127B as shown in FIG. 5. Carrier 115B may be slidingly mounted for opposite movement relative to carrier 115A as will be described below.

Carriers 115A, 115B may be preloaded, by the force of spring 124, to hold and center the workpiece S. Spring 124 may be a coil spring, leaf spring or any other suitable type of spring member. Spring 124 may push against carrier 115A to position outer gripping pins 118 and 119 in a predetermined position. As will be described below, spring 124 may also position inner gripping pins 116, 117 in a predetermined position via cable 170 as will also be described below.

In the embodiment shown, spring 124 may be located between stationary member 172 of the frame 103 and extend longitudinally along frame 103 so that spring 124 abuts the head of bolt 174. Bolt 174 may be coupled to carrier 115A. In this exemplary embodiment, the spring 124 is oriented between the head of bolt 174 and stationary member 172 to generate a biasing force on carrier 115A in the direction indicated by arrow 126 in FIG. 5. This, in effect creates the preloading of carrier 115A that positions gripping pins 118, 119 in a predetermined position. Adjustment of the amount of preload applied to the workpiece S may be increased or decreased by tightening or loosening bolt 174. In alternate embodiments, the spring may be mounted so that the preload may be adjusted in any other suitable manner.

Carriers 115A and 115B may be connected by a tackle, for example, such as cable 170 and pulley 182 allowing carrier 115B as well as carrier 115A to be preloaded by spring 124 in opposite directions to grip the substrate. Cable 170 may be coupled at ends 178, 180 respectively to carriers 115A and 115B respectively. Cable 170 may be wrapped around pulley 182 which, in turn may be rotatably coupled to frame member 103. The force or preload exerted by spring 124 on carrier 115B via the cable 170 and pulley 182 positions gripping pins 116, 117 in a predetermined position so that, in conjunction with gripping pins 118, 119, the end effector 164 may grip the workpiece S. By proper selection and positioning of the gripping pins 116-119, the workpiece may be held on the end effector securely in a predetermined position.

An actuator, such as an electrical or pneumatic solenoid 121, may be mounted for operative engagement with for example, carrier 115B (see FIG. 5). In alternate embodiments, the powered actuator may be operatively engaged to the carrier for the outer/distal gripping pins (e.g. operatively engaged to the carrier in a way similar to carrier 115A). For example, when the solenoid 121 is actuated the clamping members 116-119 move apart, releasing the substrate. This may be accomplished by engagement of the plunger 122 of solenoid 121 with carrier 115B. Solenoid 121 may, for example, be mounted on frame 103 with plunger 122 engaging carrier 115B where solenoid 121 overcomes the force of spring 124 upon engagement. Retraction of plunger 122 in the direction of arrow 184 may cause a corresponding movement of carrier 115B. The movement of carrier 115B, in turn, results in an equal and opposite movement of carrier 115A due to the coupling of carriers 115A, 115B via cable 170 and the pulley 182. The equal and opposite motion of the carriers 115A and 115B thereby causes a corresponding equal and opposite movement of pin sets 116, 117 and 118, 119.

Upon release of solenoid 121, the resilient force of spring 124 causes the opposing motion of pin sets 116, 117 and 118, 119 so that the pin sets move towards each other (and towards the center of the substrate), thus clamping the substrate. In alternate embodiments, the solenoid could be placed in other positions and/or may engage other members. As may be realized from FIG. 5, actuation of one carrier 115A, 115B via spring 124 and action of the solenoid 121 effects actuation of the other carrier 115A, 115B via cable 170 and pulley 182. In alternate embodiments, other devices may be used to actuate the movement of the carriers, such as a stepping motor, vacuum, or a pneumatic element or otherwise. Further, damping elements (not shown) may be provided to damp the motion of carriers 115A and 115B. Further, sensors (not shown) may be positioned to sense the position of the carriers. The data from the sensors may be used to move the gripping elements, for example, from a position where no workpiece is supported to positions that accommodate workpieces of different diameters or shapes.

In operation, when a substrate is to be acquired for support by end effector 164, solenoid 121 may be actuated to move carriers 115A, 115B in opposite directions as described above. This motion in turn moves inner pin set 116, 117 and outer pin set 118, 119 to their expanded position, allowing clearance between pins 116-119 and a workpiece S so that the workpiece S may be positioned on the end effector 164. The release of solenoid plunger 122 causes the movement of carriers 115A and 115B, under the influence of spring 124, to their rest position in which the pins 116-119 engage the workpiece S. Here, by opposite motion of pin sets 116, 117 and 118,119 and by the force exerted by the pins 116-119 as a result of spring 124, the substrate S is effectively centered and gripped on end effector 164.

Referring now to FIG. 6, there is shown a plan view of an end effector 264 in accordance with yet another exemplary embodiment. In this exemplary embodiment, end effector 264 is constructed for attachment to the end of movable arm 100 (see FIG. 1) and is adapted for supporting a workpiece S in a secure manner. End effector 264 includes a frame 203, the frame having an attachment end 204 and a distal end 205. The workpiece S may be supported from below on support pads 210, 211, 212. Pads 210, 211, 212 may be tapered with a slight angle and may be positioned, for example, to contact the workpiece S only along the circumferential edge. Workpiece S is held in place by gripping edges 217, 218, and 219. Gripping edges 217-219 may be equally spaced circumferentially around the edge of the workpiece S. In alternate embodiments, any suitable spacing of the gripping edges may be provided. Gripping edges 217-219 may engage the edge of workpiece S via the gripping force provided by actuating mechanism 214. Although three gripping edges are shown for illustration, in alternate embodiments, more or less than three gripping edges may be provided or a different type of engaging surface may be provided, according to the particular needs of the process and workpiece. In this exemplary embodiment, frame 203 of the end effector 264 may have, for example, a general fork shape longitudinally elongated along axis 225. Axis 225 may be substantially aligned with motion axis T (as best seen in FIG. 1). In alternate embodiments, the end effector frame may have any other suitable shape such as, for example, a paddle configuration.

The actuating mechanism 214 may have a spring loaded actuation section 214A with, for example, three carriers 215A, 215B and 215C. In this embodiment, the frame may be a one piece frame member (i.e. frame 203). Frame 203 has a unitary construction. The carriers 215A, 215B, 215C are integral to frame 203. In the embodiment shown, the frame 203 may have a rear portion 204R, which as noted before provides the attachment end for the arm 100 and the carriers 215A, 215B, 215C which are dependent from the rear portion 204R. For example, resiliently flexible elements, such as flexure sections 270A, 270B, 270C and 270D connect the movable carriers 215A, 215B, 215C to the static rear portion 204R. In this exemplary embodiment, flexure sections 270A, 270B, 270C and 270D and carriers 215A, 215B and 215C may be integrally formed as part of frame 203 and may be fabricated as disclosed in U.S. Pat. No. 6,174,011 which is hereby incorporated by reference in its entirety. In alternate embodiments, these sections may be fabricated and assembled separately or by any other suitable methods. As shown in FIG. 6, the flexure sections 270A, 270B, 270C are formed with substantially parallel slender beams. For example, flexure section 270C, which corresponds to carrier 215B is formed of flexure elements that are substantially parallel slender beams. In the embodiment shown, the flexure elements are oriented or angled inwards or toward the center line of the end effector 264. The flexure elements are oriented inward forming a guided cantilever so that the flexure of flexure section 270C relative to the static rear portion 204R causes the guided movement of carrier 215B and in particular gripping edge 218 to move in the direction of arrow 190A. The direction of arrow 190A may be orthogonal to the angle of the flexure elements so that the movement of the carrier 215B and in particular gripping edge 218 is radial to the center of the workpiece S. In alternate embodiments, any suitable number of flexure elements or beams of desired proportion may be used. In yet other alternate embodiments, the flexure elements or beams may have any suitable shape. For example, the flexure elements may be oriented at other angular orientations. In yet other alternate embodiments, the flexure elements may provide a rotational movement of the gripping edge or any other suitable motion for gripping and release the workpiece.

Carrier 215B may be an elongated member that extends longitudinally towards the distal end 205 of the frame 203. Carrier 215B may be connected to frame portion 204R by flexures 270C. In this exemplary embodiment, flexures 270C cooperate with carrier 215B and frame portion 204R so that gripping edge 218 may be preloaded against the edge of wafer S. Movement of carrier 215B relative to frame portion 204R, by flexing flexure section 270C, is in the direction of arrow 190A corresponding to a centered location of the center of workpiece S.

Referring now to FIG. 7, there is shown a partial plan view of the end effector of FIG. 6. In FIG. 7, position 193A corresponds to the position of gripping edge 218 while preloaded against workpiece S by flexures 270C. Position 193B corresponds to the relaxed position of clamp 218, for example when no workpiece is present and the flexures 270C are relaxed. Position 193C corresponds to the position of clamp 218 displaced away from workpiece S in an ungripped position.

Referring back to FIG. 6, carrier 215C may be an elongated member, similar to but opposite to carrier 215B, that extends longitudinally towards the distal end 205 of the frame 203. Carrier 215C is connected to frame portion 204R by corresponding flexure 270D. Flexure 270D is generally similar to but opposite flexure 270C. In this exemplary embodiment, flexures 270D may cooperate with carrier 215C and frame 203 whereby gripping edge 219 may be preloaded against the edge of wafer S in a manner substantially similar to that described above for carrier 215B. Movement of carrier 215C relative to frame portion 204R, by flexing flexure section 270D, may be in the direction of arrow 190B. The direction of arrow 190B corresponds radially to a centered location of the center of workpiece S. Gripping edge 219 may have a preloaded position, a relaxed position and an ungripped position substantially similar to that of edge 218 as described above.

Carrier 215A may be connected to frame portions 203W of frame 203 by flexures 270A and 270B. Frame portions 203W are substantially rigid relative to flexures 270A, 270B. Flexures 270A, 270B are formed of flexure elements which are substantially parallel slender beams similar to the flexure elements of flexures 270C, 270D. In the embodiment shown, the flexure elements are oriented or angled inwards (i.e. towards the center of the workpiece S) towards each other and toward the centerline of the end effector 264. The flexure elements are angled relative to each other so that the flexure of flexure sections 270A, 270B relative to the frame portions 203W causes carrier 215A and in particular gripping edge 217 to move in the direction of arrow 190C. The flexure elements are also angled as shown in FIG. 6 so that when carrier 215A is moved in the direction of 190C the flexures 270A, 270B interact with sections 203W so that the carriers 215B, 215C and their corresponding griping members move in the directions of 190A, 190B respectively, as will be described below. In alternate embodiments, any suitable number of flexure elements or beams of desired proportion may be used. In yet other alternate embodiments, the flexure elements or beams may have any suitable shape or configuration such as, for example, other angular orientations.

Flexures 270A and 270B cooperate with carrier 215A and frame 203 so that gripping edge 217 may be preloaded against the edge of wafer S. Movement of carrier 215A relative to frame 203 may be achieved by flexing flexure sections 270A and 270B. Movement of carrier 215A may be in the direction of arrow 190C. The direction of arrow 190C corresponds radially to a centered location of the center of workpiece S. Gripping edge 217 may have a preloaded position, a relaxed position and an ungripped position substantially similar to that described above for edges 218, 219. Gripping edges 217-219 having clamping directions 190A-190C may cooperate to both clamp and center a wafer repeatably, relative to frame 203. For example, when a wafer is clamped, flexures 270A, 270B push gripping edge 217 against an edge of the wafer while simultaneously pulling frame portions 203W inward. The cooperation of the inward force exerted on frame portions 203W by flexures 270A, 270C along with the preload provided by flexures 270C, 270D on carriers 215B, 215C respectively cause the gripping of the wafer. Further, workpiece S is released by displacing carrier 215A longitudinally toward the end 204 of end effector 264 in the direction of arrow 190C and by displacing, through the cooperation of flexures 270A, 270B, carriers 215B and 215C. Gripping edges 217, 218 and 219 are fixedly attached to the members 215A, 215B and 215C respectively and provide the outer means by which the workpiece is held.

By proper selection and positioning of the gripping edges 217-219, the substrate or workpiece may be held on the end effector securely in a predetermined position. An actuator, which is shown, for example, as an electrical or pneumatic solenoid 221, may be mounted on frame 203 for operative engagement with carrier 215A. The actuation of solenoid 221 may move carrier and gripping edge 217 in the direction of arrow 284. The movement of carrier 215A in the direction of arrow 284 causes flexure sections 270A, 270B to push out on carriers 215B, 215C which in turn causes flexure section 270C, 270D to flex. The flexing of flexure sections 270A-270D allows carriers 215B, 215C and gripping edges 218, 219 to move apart and away from the center of the workpiece S thereby releasing the workpiece S. This is accomplished by engagement of the plunger 222 of solenoid 221 on carrier 215A. Retraction 284 of plunger 222 in the direction of arrow 284 will cause a corresponding release movement of carrier 215A. The movement of carrier 215A may result in a corresponding release movement of carriers 215B and 215C due to the corresponding coupling of flexures 270A and 270B. Solenoid 221 may, for example, be mounted on frame 203 with plunger 222 engaging carrier 215A where solenoid 221 overcomes the preloaded force of the flexures on engagement.

Upon release of solenoid 221, the flexures 270A-270D cause an opposite motion, thus clamping the workpiece. For example, flexures 270A, 270B cause carrier 215A and gripping edge 217 to move in a direction opposite arrow 284 while at the same time flexures 270C, 270D cause carriers 21B, 215C and gripping edges 218, 219 to move towards the center of the workpiece. In alternate embodiments, the solenoid could be placed in other positions and/or may engage other members. In this exemplary embodiment, actuation of one carrier 215A effects actuation of the other carriers 215B, 215C via flexures 270A-270D. In alternate embodiments, other devices may be used to actuate the movement of the individual carriers, such as a stepping motor, vacuum, or a pneumatic element or otherwise. Further, in other alternate embodiments, damping elements (not shown) may be provided to damp the motion of carriers 215A-215C. In yet other alternate embodiments, sensors (not shown) can be positioned to sense the position of the carriers. The data from the sensors may be used to move the gripping elements, for example, from a position where no workpiece is supported to positions that accommodate workpieces of different diameters or shapes.

In operation, when a workpiece is to be acquired for support by end effector 264, solenoid 221 may be actuated to move the gripping edges 217-219 radially away from the center of the workpiece S. This motion in turn moves gripping edges 217-219 to their expanded position, allowing clearance between the gripping edges 217-219 and the workpiece S so that the workpiece S may be positioned on the end effector 264. Release of solenoid plunger 222 causes the movement of carriers 215A-215C, under the influence of flexures 270A-270D, to their rest position if there is no workpiece or, when a workpiece is present, to a preloaded clamped position in which the gripping edges 217-219 engage, for example, the edge of the workpiece S. In this exemplary embodiment, the workpiece S is effectively centered and gripped on end effector 264 by the motion of gripping edges 117-119.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A flat workpiece transport apparatus comprising:
    a movable arm; and
    an end effector connected to the arm, the end effector having a movable grip for holding a flat workpiece on the end effector, and having a grip actuator operably connected to the movable grip;
    the grip actuator having more than one actuation members and a resiliently flexible member connecting the more than one actuation members, each actuation member actuating at least one corresponding grip element of the movable grip to capture or release the workpiece;
    wherein, pivoting movement of one of the more than one actuation members causes flexure and relaxation of the resiliently flexible member, the flexure and relaxation of the resiliently flexible member effects corresponding pivotal movement of at least another of the more than one actuation members for actuation of the at least one corresponding grip element of the at least another of the more than one actuation members reciprocatively between positions for gripping and releasing the flat workpiece, and wherein the resiliently flexible member is sandwiched by substantially rigid portions of the more than one actuation members.

2. The apparatus according to claim 1, wherein the grip actuator has a pair of actuation members.

3. The apparatus according to claim 1, wherein the grip actuator has at least two opposed actuation members.

4. The apparatus according to claim 1, wherein the grip actuator comprises a one-piece member that forms the more than one actuation members and the resiliently flexible member.

5. The apparatus according to claim 1, wherein the movable grip has one or more actuated grip elements on opposite sides of the workpiece when the workpiece is held by the movable grip.

6. The apparatus according to claim 1, wherein the grip elements of the movable grip are edge grip elements.

7. The apparatus according to claim 1, wherein the movable grip has actuated grip elements located on the end effector so that the grip elements center the workpiece, with respect to a predetermined end effector location, when actuated to capture the workpiece.

8. The apparatus according to claim 1, wherein one of the more than one actuation members is a driver driving another of the more than one actuation members.

9. The apparatus according to claim 1, wherein movement of the at least one corresponding grip element of the movable grip is rectilinearly longitudinal with respect to a longitudinal axis of the end effector.

* * * * *